United States Patent [19]
Tennant et al.

[11] Patent Number: 5,627,112
[45] Date of Patent: May 6, 1997

[54] METHOD OF MAKING SUSPENDED MICROSTRUCTURES

[75] Inventors: William E. Tennant; Isoris S. Gergis, both of Thousand Oaks; Charles W. Seabury, Agoura Hills, all of Calif.

[73] Assignee: Rockwell International Corporation, Seal Beach, Calif.

[21] Appl. No.: 555,668

[22] Filed: Nov. 13, 1995

[51] Int. Cl.$^6$ .................................................. H01L 21/77
[52] U.S. Cl. .......................... 438/113; 438/458; 438/55; 438/51; 438/466
[58] Field of Search .......................... 437/228, 228 O, 437/229, 227, 901, 921, 974, 7; 148/DIG. 12, DIG. 135

[56] References Cited

U.S. PATENT DOCUMENTS

| | | | |
|---|---|---|---|
| 4,426,758 | 1/1984 | Black et al. | 437/901 |
| 4,847,500 | 7/1989 | Pedder | 250/338.3 |
| 4,859,629 | 8/1989 | Reardon et al. | 437/974 |
| 5,018,256 | 5/1991 | Hornbeck | 437/228 O |
| 5,037,779 | 8/1991 | Whalley et al. | 437/901 |
| 5,045,503 | 9/1991 | Kobiki et al. | 437/974 |
| 5,059,556 | 10/1991 | Wilcoxen | 437/901 |
| 5,090,819 | 2/1992 | Kapitulnik | 374/176 |
| 5,099,120 | 3/1992 | Turnbull | 250/338.2 |
| 5,258,325 | 11/1993 | Spitzer et al. | 437/974 |
| 5,438,875 | 8/1995 | Fung et al. | 437/901 |
| 5,508,231 | 4/1996 | Ball et al. | 437/974 |

FOREIGN PATENT DOCUMENTS

| | | |
|---|---|---|
| 2265754 | 10/1993 | United Kingdom . |
| 93/25877 | 12/1993 | WIPO . |
| 93/25878 | 12/1993 | WIPO . |

*Primary Examiner*—Michael Trinh
*Attorney, Agent, or Firm*—John J. Deinken; George A. Montanye; James P. O'Shaughnessy

[57] ABSTRACT

A suspended microstructure process assembly includes a first microstructure assembly, with a temporary substrate having a first surface and a first microstructure fabricated on the first surface; a second microstructure assembly, including a final substrate having a second surface and a second microstructure fabricated on the second surface; connecting elements for joining the first microstructure assembly to the second microstructure assembly with a predetermined separation and alignment; and a removable bond temporarily securing the first microstructure assembly to the second microstructure assembly until the temporary substrate is removed. The connecting elements may be electrically conductive contacts or electrically nonconductive spacers. Electrically conductive contacts may be supplied to the first microstructure from a back side of the first microstructure assembly. The first microstructure fabricated on the first surface may incorporate a removable layer to enable multiple level suspended structures.

10 Claims, 12 Drawing Sheets

1

METHOD OF MAKING SUSPENDED MICROSTRUCTURES

BACKGROUND OF THE INVENTION

This invention is concerned with the fabrication of microstructures composed of multiple substructures which must be prepared using incompatible processing steps but which must be integrated in close physical association in the ultimate microstructure end product.

Suspended microstructures have been developed for a variety of applications, primarily those requiring thermal or mechanical isolation for their operation. In the thermal isolation category, the microbolometer is probably the best example. A microbolometer uses an array of small thermal sensors which is suspended above a multiplexing integrated circuit using conventional surface micro machining techniques.

The category of devices suspended for mechanical isolation includes many micromechanical applications. Numerous discrete devices, such as accelerometers, gyroscopes, microphones, pressure sensors, and moving mirror displays, have been made using both surface and bulk processing techniques.

The current state of the art for infrared bolometer arrays is best represented by the Honeywell process, which involves the deposition, etching, and patterning of various materials directly on top of a silicon integrated circuit. Because of the sensitivity of the integrated circuit to such conditions as high temperature, ion bombardment, or chemical environment, these additional processing steps are severely restricted. Compromises are required in the processing, the selection of materials, and the resulting device quality.

SUMMARY OF THE INVENTION

The invention involves a method of making a suspended microstructure which includes the steps of:

providing a temporary substrate with a first surface, fabricating a first microstructure on the first surface to form a first microstructure assembly, providing a final substrate with a second surface, fabricating a second microstructure on the second surface to form a second microstructure assembly, forming at least one connecting element joining the first microstructure assembly and the second microstructure assembly with the first and second surfaces opposed with a predetermined separation and alignment, introducing a removable bonding medium between the first and second microstructures to temporarily secure the two microstructure assemblies, removing the temporary substrate, and removing the bonding medium, thereby leaving the first microstructure affixed to the final substrate while preserving the separation and alignment between the first and second microstructures.

The step of attaching at least one connecting element may further involve attaching at least one electrically conductive contact to establish an electrical connection between the first and second microstructures. Alternatively, the step of attaching at least one connecting element may be accomplished by attaching at least one electrically nonconductive spacer between the first and second microstructure assemblies.

A more particular embodiment of the method includes, after the step of removing the temporary substrate, forming at least one electrically conductive contact to the first microstructure from a back side of the first microstructure assembly.

The step of fabricating a first microstructure may include the fabrication of a removable layer to enable multiple level suspended structures.

The step of introducing a removable bonding medium may be carried out by injecting an organic bonding medium between the first and second microstructures, in which case the step of removing the bonding medium involves removing the organic bonding medium by dry etching with an oxygen plasma.

A suspended microstructure process assembly fabricated according to the invention includes a first microstructure assembly, with a temporary substrate having a first surface and a first microstructure fabricated on the first surface; a second microstructure assembly, including a final substrate having a second surface and a second microstructure fabricated on the second surface; connecting elements for joining the first microstructure assembly to the second microstructure assembly with a predetermined separation and alignment; and a removable bond temporarily securing the first microstructure assembly to the second microstructure assembly until the temporary substrate is removed.

The connecting elements may be electrically conductive contacts, or electrically nonconductive spacers. Electrically conductive contacts may be supplied to the first microstructure from a back side of the first microstructure assembly. In addition, the first microstructure fabricated on the first surface may incorporate a removable layer to enable multiple level suspended structures.

DESCRIPTION OF THE INVENTION

This invention is concerned with the fabrication of suspended thin film microstructure elements, or arrays of elements, on semiconductor integrated circuits. The fabrication is accomplished by forming the microstructures on a temporary substrate, then transferring this intermediate assemblage onto a silicon wafer and removing the temporary substrate. The invention may be illustrated by describing several examples of one preferred implementation, which involves thermal infrared focal plane arrays (IR FPAs) with microstructures made from temperature sensitive devices, such as resistors, semiconductor diodes, pyroelectric capacitors, or thermoelectric junctions. The suspended microstructures, because they are made with thin films, have very low thermal capacity and are designed to have high thermal isolation from the substrate, both important attributes for thermal detectors. Two approaches are contemplated for fabricating the thermal array microstructures. In both of these approaches, the electrical interconnections between the structures and the silicon integrated circuits also provide mechanical support for the suspended thin film structures. In the first scheme, the interconnections are accomplished with pairs of indium or solder bumps formed separately on the detector array wafers and on the multiplexer wafers, then joined on a one-to-one basis. In the second scheme, the interconnections are made with metal thin films which are deposited after the removal of the temporary substrate to join the microstructures to the silicon integrated circuits. These two approaches are described in more detail below for the example of $VO_2$ thin film resistors. A third scheme which extends the first two schemes into more than one level of suspended structures is also described.

Embodiment 1

Figure 1A:
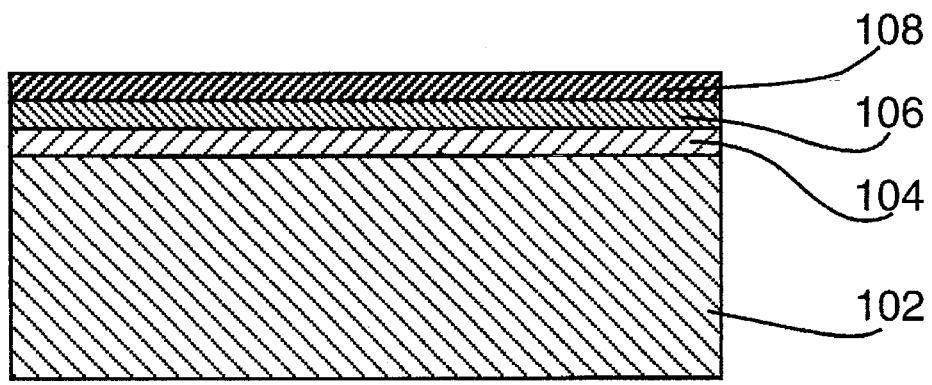
FIGS. 1A–1E are cross sectional schematic diagrams depicting the steps in fabricating a suspended microstructure according to the invention.

In the first scheme, the process begins, as depicted in the cross-sectional drawing of FIG. 1A, with obtaining a temporary silicon wafer substrate 102 of good crystalline quality (suitable for semiconductor circuit processing) such as is readily obtainable from numerous vendors. A layer 104 of $SiO_2$ 100–200 nanometers thick is deposited on the working surface by any of several techniques-typically a thermal process is used to produce the oxide. This oxide layer provides an adhering surface for subsequent depositions, but is thin enough to avoid causing undue stress in the subsequent structures which are formed over it.

A first $Si_3N_4$ layer 106 is deposited over the $SiO_2$ layer, again by any of several techniques which will be readily apparent to a person of ordinary skill in the art. Although a stress free film is not essential for this embodiment, low stress in this layer is highly desirable, since it will allow a minimal amount of curvature in the final free-standing structure and will thereby afford the greatest freedom in the choice of device architecture.

A layer 108 of $VO_2$ is then deposited on the $Si_3N_4$ layer at a temperature selected to yield the best thermal and electrical properties (typically about 550° C.). Note that this step illustrates one of the most valuable aspects of this invention-namely the ability to select an optimal process (in this case high deposition temperature) for the fabrication of a first microstructure (in this case thermal detector arrays) even though that process is incompatible with a second microstructure (in this case a silicon-based multiplexer integrated circuit readout) on which the suspended microstructures are eventually attached.

Figure 1B:
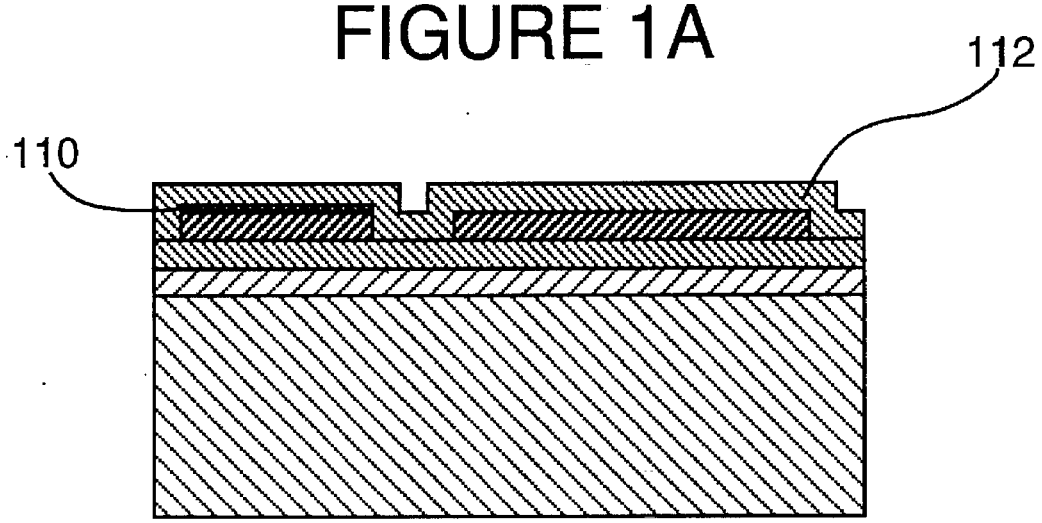

As shown in FIG. 1B, the $VO_2$ layer 108 is patterned into detectors (several formats are known to those skilled in the art) by standard photolithographic techniques—typically using a dry etch procedure. In regions where contacts will be made, contact metal layers (typically Ti and Ni) are deposited and patterned photolithographically, leaving contact layers such as the contact layer 110. The patterned detectors and contact metals are overcoated with a second layer 112 of $Si_3N_4$.

Figure 1C:
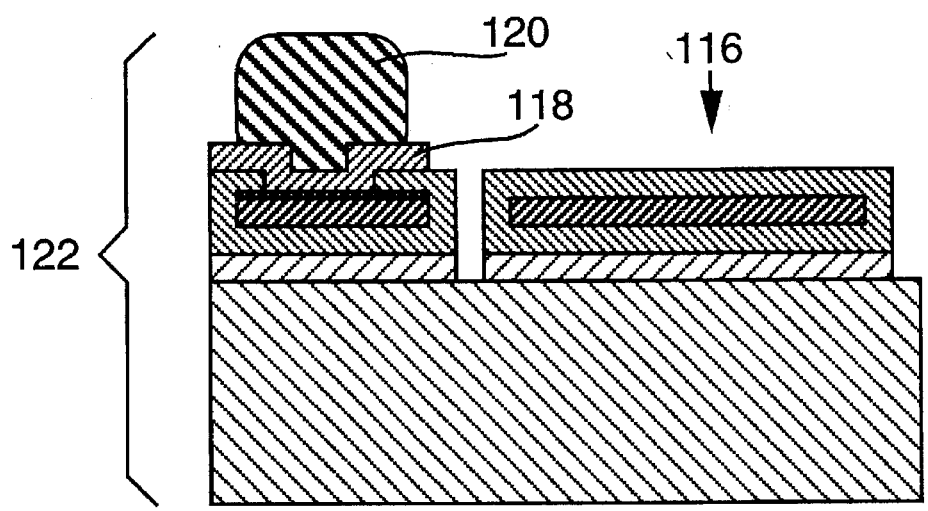

As depicted in FIG. 1C, the overcoated wafer is then photolithographically patterned with a mask containing contact hole patterns and via holes are etched in the overcoat nitride by reactive ion etching (RIE), stopping at the contact metal surface. The free standing structures can now be delineated before attaching them to the Si-based multiplexer as detailed here, or they can be delineated at a later stage of device fabrication as described in Embodiment 2. Either procedure is applicable to all embodiments described in this application. Another photolithographic mask, containing patterns for the free standing detector structures, such as shown generally at the location 116, is applied and the patterns are delineated, also using reactive ion etching through the nitride and $SiO_2$ films. This is followed by the deposition of metal contact pads, such as the pad 118, and indium bumps, such as the bump 120, using photolithographic delineation. The bump is selected from the group consisting of alloys of indium, tin, lead, bismuth, and gallium.

Figure 1D:
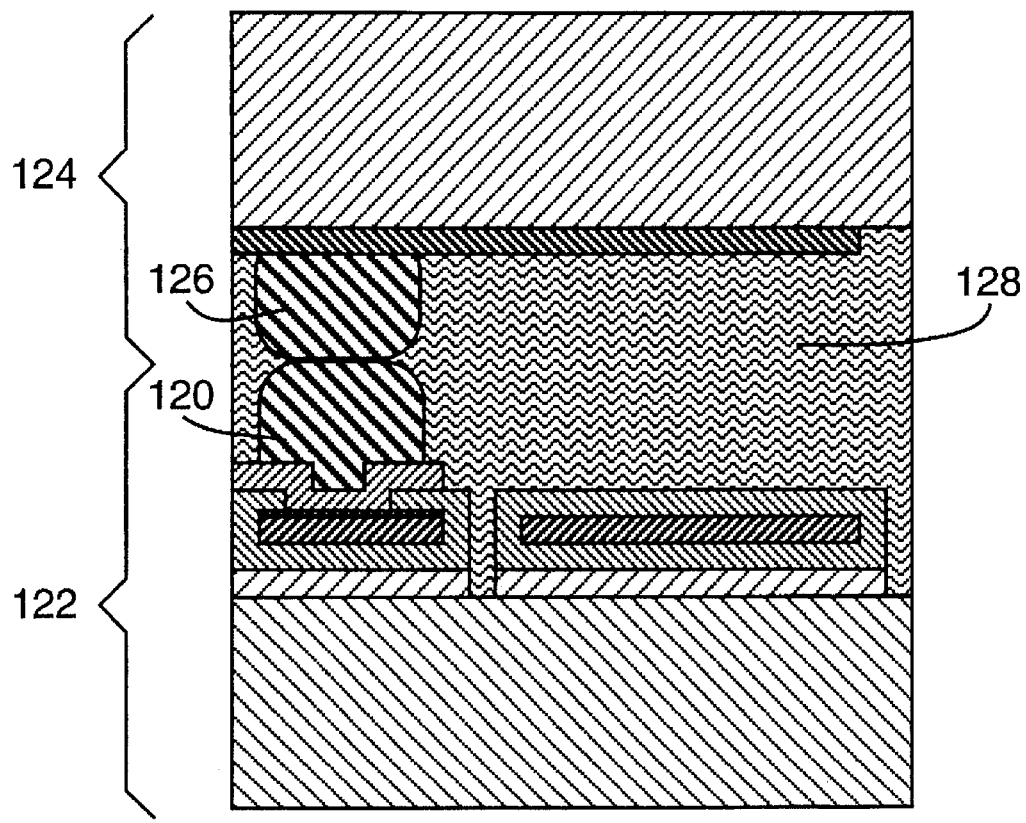

At this point the processed silicon substrate 1522 contains microstructures ready for attaching to a second silicon wafer containing a second set of microstructures through a "hybridization" process, which is well known to those versed in the art. As shown in FIG. 1D, a multiplexer wafer 124 containing corresponding microstructure arrays of circuits (typically designed to suit the particular thermal detector application intended) and similarly prepared for hybridization is obtained. The wafer 122 with the microcircuit arrays of thermal detectors is hybridized to the water 124 with the microcircuit multiplexer arrays—typically by use of a micropositioning aligner which applies force and heat to form compression welds between corresponding In columns, such as the column 120 and an indium column 126 on the multiplexer wafer, which function as connecting elements between the wafers. The final height of the welded In bumps essentially determines the spacing between the two wafers, which ultimately establishes the separation of the suspended microstructures from the multiplexer. The hybrid structure is filled with epoxy 128, typically by vacuum injection into the spaces between the wafers and around the indium bumps. The epoxy is cured, typically with some heating, depending on the requirements of the specific epoxy.

Figure 1E:
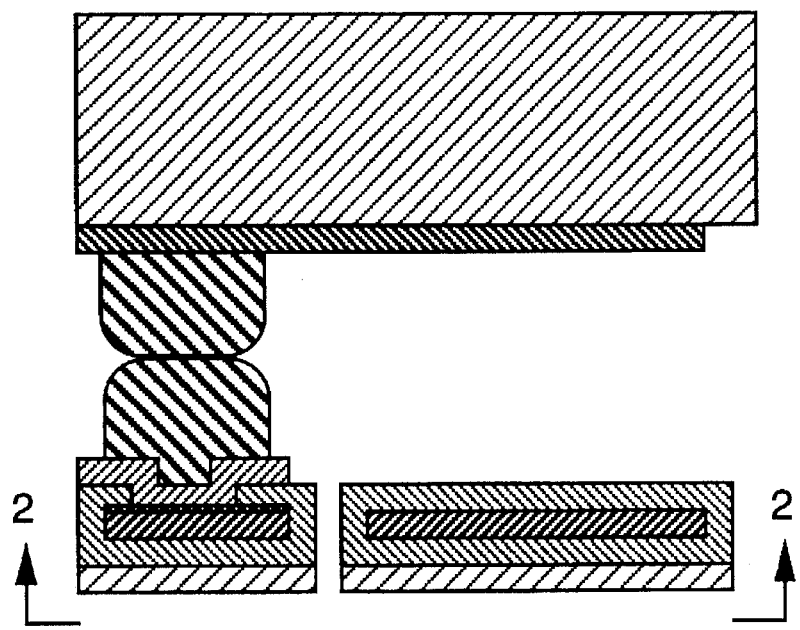

As shown in FIG. 1E, mechanical lapping or grinding is used to remove all but a thin (2–5 mil) amount of the substrate under the detector structures. Reactive ion etching with the appropriate gas species (well known to those versed in the silicon processing arts) is used to complete removal of this silicon wafer. Alternately a wet chemical etch (such as KOH solution) can be used to remove the Si from the temporary substrate with negligible dissolution of the underlying $SiO_2$ film since the etchant is highly selective toward etching Si. Protection of the backside of the multiplexer wafer may be necessary by overcoating it with an oxide or a nitride film.

Figure 2:
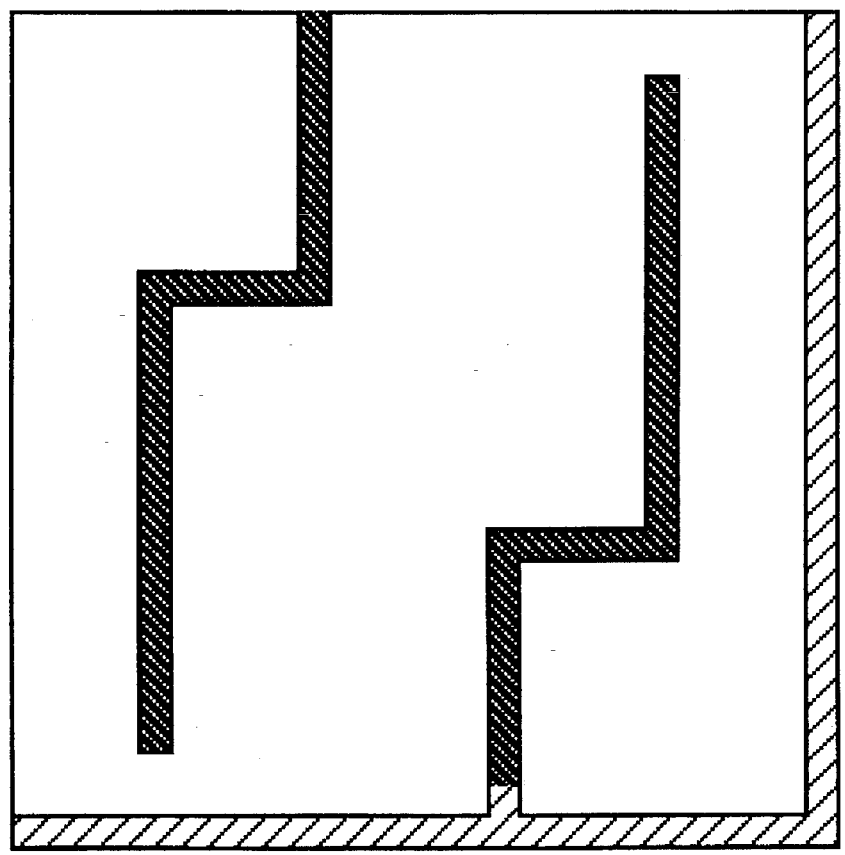
FIG. 2 is a plan view which illustrates the suspended detectors achieved by the fabrication process of FIGS. 1A–E.
Figure 3:
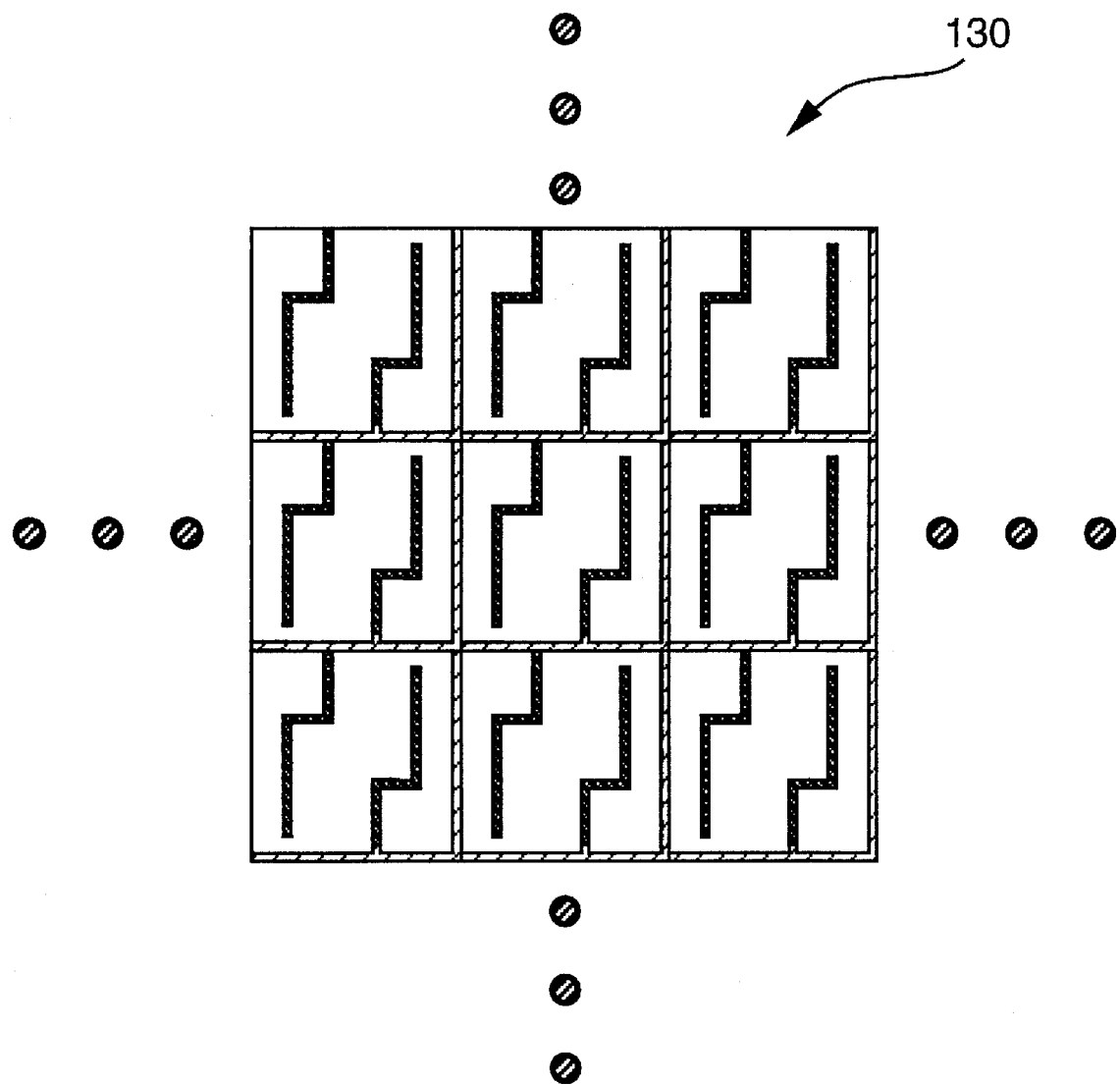
FIG. 3 is a plan view illustrating how the individual detectors of FIG. 2 can be combined to form a two dimensional detector array.

At this point the hybridized microstructure arrays may be diced apart to separate them into individual devices. An oxygen plasma is now employed to remove the epoxy layer, which has been exposed around the delineated detectors by the removal of the silicon. This dry etch process is sufficiently omnidirectional to remove even the portion of the epoxy under the detectors, leaving the detectors free standing and suspended by the In bump contacts, which also provide electrical contact to the detectors. The suspended position of the detectors is further illustrated by FIG. 2, which is a plan view toward the detector side of FIG. 1E. FIG. 3 illustrates how the individual detectors can be combined to form a two dimensional detector array 130.

The use of the epoxy backfill and dry etching represents a major improvement over the current state of the art, since the processor does not have to contend with the contamination and surface tension effects inherent in other processes used in the prior art to obtain a free-standing structure. This final epoxy removal step may be accomplished, if desired, after the device has been packaged into a system or holder to facilitate further handling. The finished devices are now available for use.

First Variant of Embodiment 1

A first variant of the above embodiment may be used where the fabrication is designed for a thermal detector device based on the variation in electrical properties with temperature of a thermally isolated piece of silicon, silicon diode, silicon transistor or other junction device readily obtained in wafer form from a commercial foundry. In this embodiment, the devices are fabricated on a SOI (silicon on insulator) wafer which consists of a single crystal Si film on a thin $SiO_2$ film deposited on a bulk Si wafer. The temperature sensitive devices (diode, transistor, etc.) are made from the top Si thin film using standard Si microelectronic fabrication processes adapted to SOI devices. The buried oxide layer provides an etch stop during the removal of the Si substrate.. SOI wafers are now commercially available from several sources. The simplest array (and, for some applications, one of the best) consists of silicon diodes.

These arrays are patterned with metal pads and In bumps as discussed above with respect to the first embodiment. At this point, further processing of the wafer with its detector arrays is accomplished identically to the steps described above for the first embodiment after the patterning of metal pads and In bumps. It should also be noted that these detectors may be used with the second embodiment process below or one of its variants, as will be evident to those skilled in the art.

Second Variant of Embodiment 1

Using a second variant of embodiment 1, thermal detectors based on the pyroelectric effect in ferroelectric materials are also feasible, with the device taking the form of a capacitor prepared with a thin film ferroelectric material as the dielectric. Note that the term "pyroelectric" refers to either a pyroelectric of a ferroelectric film. The example described here utilizes a transverse capacitor in which the polar axis of the material is in the plane of the film and the electrodes are placed on the: same side of the dielectric. Certain polycrystalline ferroelectric materials, whose crystalline structure in the paraelectric phase is cubic, can be poled in any particular direction with application of an appropriate electric field at temperatures close to their ferroelectric/paraelectric phase transition. The transverse configuration is most suitable with ferroelectric materials exhibiting high dielectric constants and offers several advantages over conventional capacitor detectors, including: higher voltage output, simpler fabrication processing, and lower sensitivity to pin holes in the ferroelectric thin film.

Figure 4A:
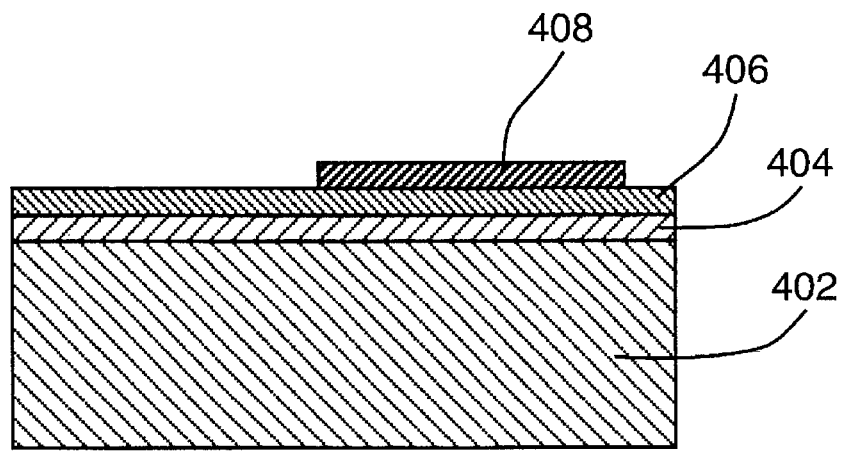
FIGS. 4A–4E are similar to FIGS. 1A–E, but depict an embodiment of the invention suitable for fabricating pyroelectric detectors.
Figure 4B:
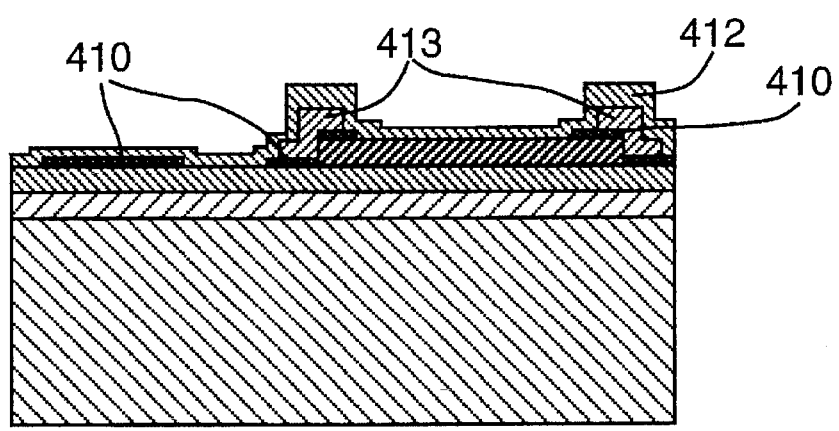

As shown in FIG. 4A, $SiO_2$ and nitride layers 404 and 406 are first deposited on a Si substrate 402. A pyroelectric film 408 is deposited using one of the methods known in the art, such as sputter deposition or sol-gel. Proceeding to FIG. 4B, the pyroelectric film is first delineated into individual detectors using, for example, ion beam milling to remove the material outside the detector pattern and stopping on the underlying nitride layer. Electrodes made with a thin metal film of high thermal resistance and compatible with the pyroelectric material, such as Pt, are deposited and lithographically delineated, as shown at 410. The electrodes extend beyond the edges of the capacitor along the suspended structure to where the indium bumps will be deposited. A thicker metal film 413, such as Al, is sputter deposited to ensure adequate electrical continuity across the edges of the pyroelectric film. The Pt film may not be continuous in these areas since it is typically much thinner than the pyroelectric film. The Al film is delineated lithographically and reactive ion etched to form narrow strips which span the edge regions but will not add significantly to the thermal mass or thermal conductance of the detector. A second nitride film 412 may be deposited to balance stresses in the suspended structure. Via holes and indium bumps are then prepared as detailed above and the process proceeds as described in the first example of Embodiment 1.

Figure 4C:
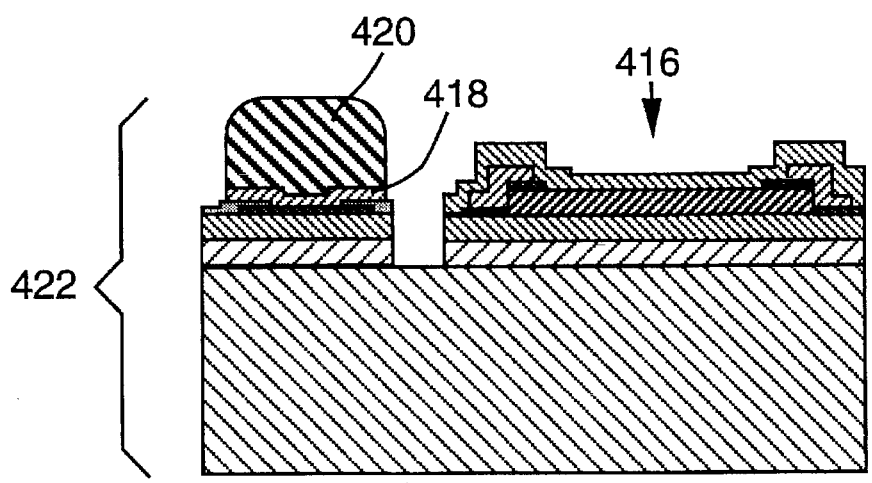

As depicted in FIG. 4C, the overcoated wafer is then photolithographically processed, followed by the deposition of metal contact pads, such as the pad 418, and indium bumps, such as the bump 420.

Figure 4D:
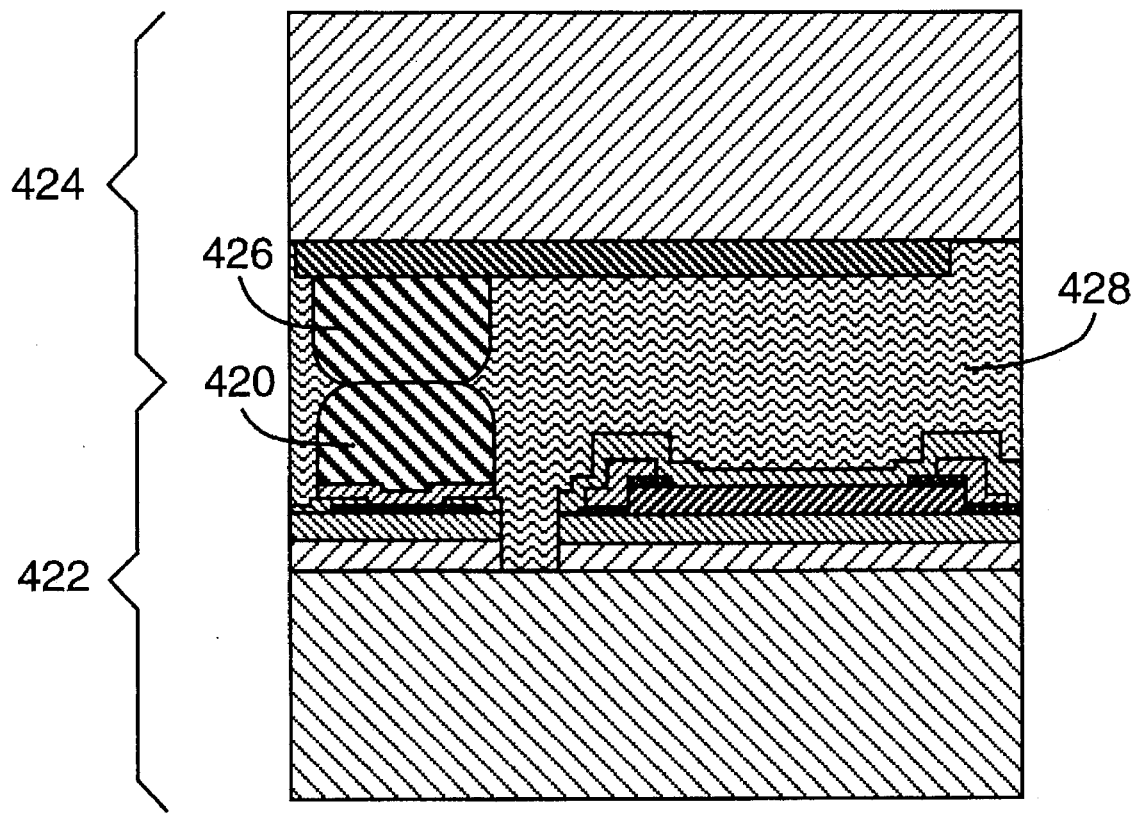
Figure 4E:
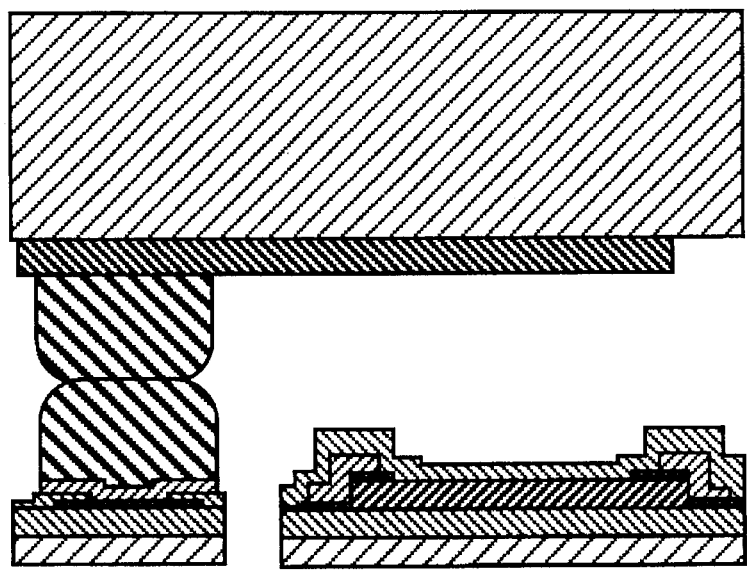

As shown in FIG. 4D, a multiplexer wafer 424 is hybridized to the wafer 422 and the hybrid structure is filled with epoxy 428. FIG. 4E depicts the final assembly after the substrate and the epoxy have been removed.

Embodiment 2

Figure 5A:
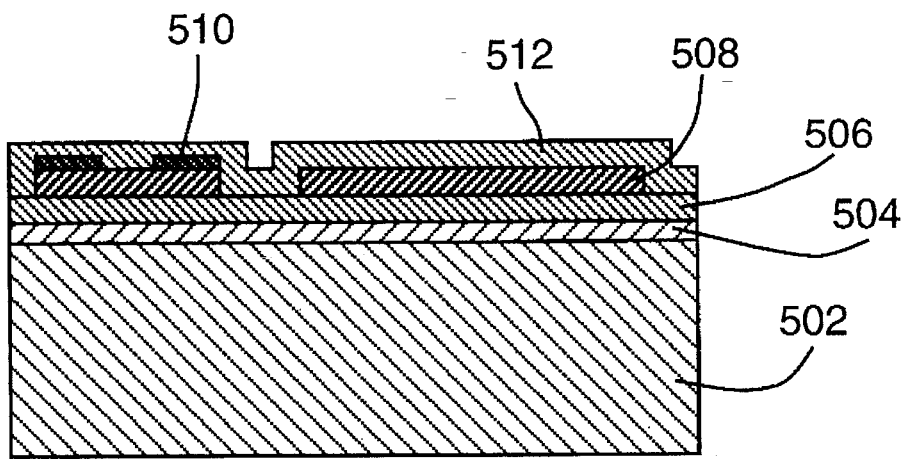
FIGS. 5A–5E also are cross sectional schematic diagrams depicting the steps in fabricating a suspended microstructure, but directed toward an embodiment in which a bolometer array is constructed.

The fabrication of bolometer arrays, depicted in FIGS. 5A through 5E, proceeds similar to the process for Embodiment 1, including, as in FIG. 5A, depositions on a silicon wafer substrate 502 of an $SiO_2$ layer 504, an $Si_3N_4$ layer 506, and a $VO_2$ layer 508, followed by contact metal pads, such as the contact pad 510. In this embodiment, however, the pads are made annular in shape, for reasons explained below, rather than as solid rectangles. This is followed by the deposition of a nitride overcoat 512 as in Embodiment 1.

Figure 5B:
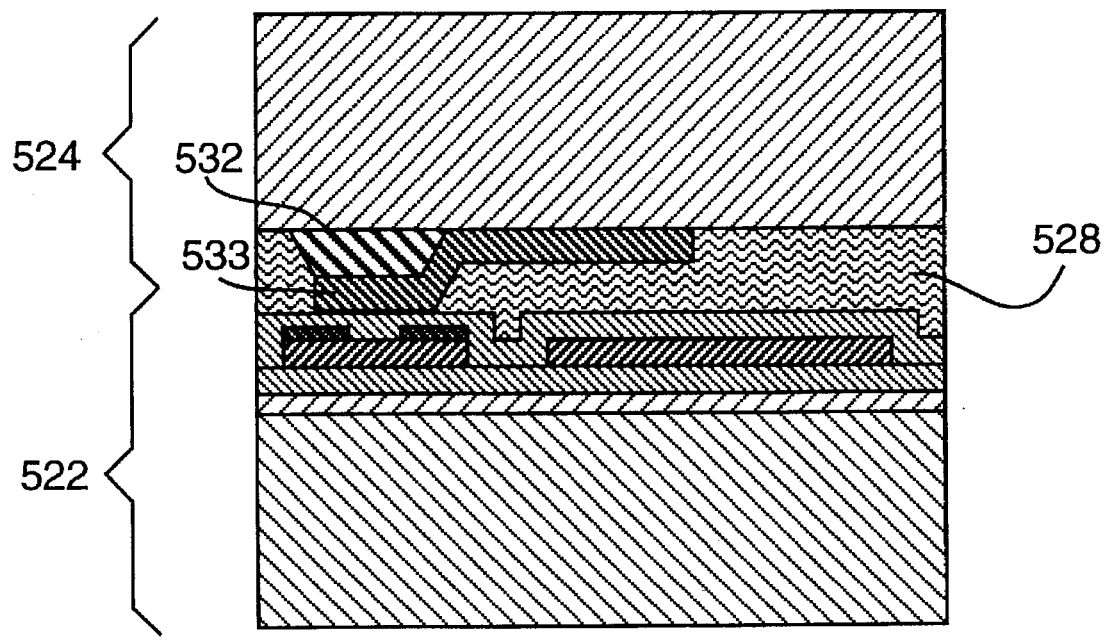

Proceeding to FIG. 5B, spacer posts, such as the post 532, are deposited on the multiplexer wafer 524. The posts can be made of $SiO_2$, glass or a metal such as aluminum. In the case of insulating posts, a suitable metal film 533 such as Al is deposited and delineated to form caps on the top surfaces of the posts and also to connect electrically to the input leads of the Si integrated circuit.

Figure 5C:
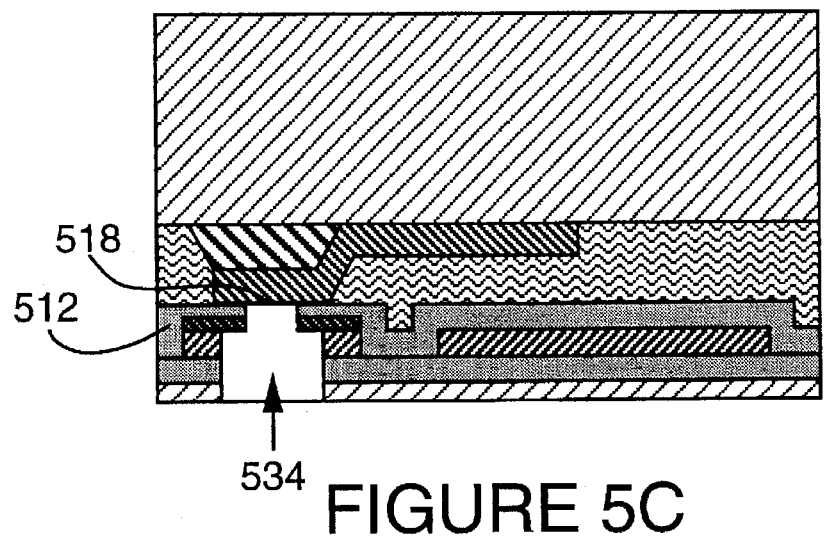

The detector wafer 522 with the suspended microstructures is bonded to the multiplexer wafer 524 using an epoxy adhesive 528. The bonding is accomplished in a fixture similar to the hybridization fixture used in Embodiment 1. The two wafers are positioned so that the contact metal pads of the detectors and multiplexer cells are aligned. The bonding apparatus applies a uniform pressure normal to the wafers so that the tops of the posts, on either the detector or multiplexer wafer, come into intimate contact with the other wafer. While the apparatus holds the two wafers together in a registered manner, epoxy is injected between the layers and cured to solidify the attachment. The silicon substrate is then removed from the detectors, as in Embodiment 1, with a combination of mechanical thinning and reactive ion etching. As shown in FIG. 5C, the microstructure pattern is lithographically defined and delineated using dry etching methods. Vias, such as the contact hole 534, are then opened in the transferred thin film structures through the oxide and first nitride layers, going through the second nitride film 512 in the holes within the annular contact pads and stopping on the detector contact metal 518. This is followed by dry etching in an oxygen plasma to remove any thin epoxy layer that may exist in the vias between the bolometer and the multiplexer contact pads.

Figure 5D:
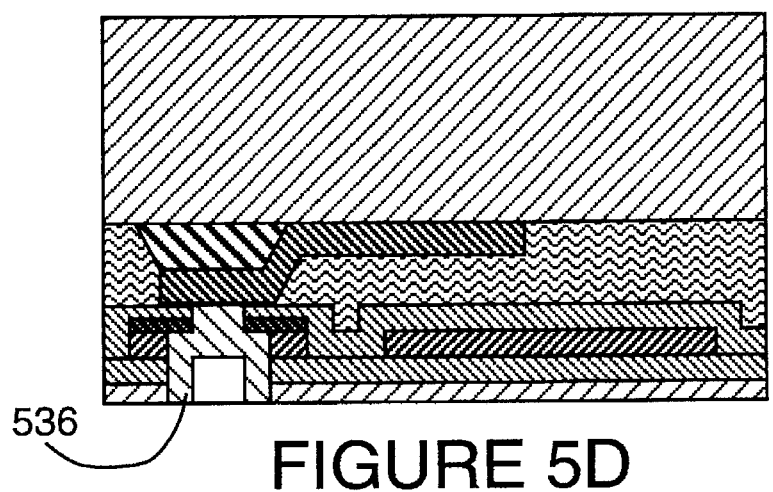
Figure 5E:
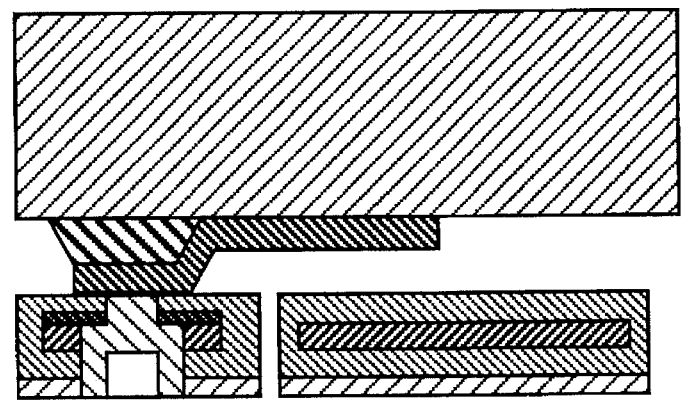

Now, as shown in FIG. 5D, the interconnections are made by depositing a relatively thick (1–1.5 microns) film 536, using a malleable metal such as Al or In, applying a lithographic mask defining the interconnect areas, and etching the metal outside the interconnect area with a suitable etchant. The metal thus deposited joins both the detector and the multiplexer metal pads. These interconnections serve the same purpose as the indium bump welds in Embodiment 1; namely, to make electrical contacts between the multiplexer cells and the detectors, as well as providing mechanical connections to the suspended detector structures once the epoxy is removed. The wafers are then diced into individual devices and the epoxy is removed using oxygen plasma as in Embodiment 1, leaving the completed detector as shown in FIG. 5E. An advantage of this process is that it avoids the use of the large force needed for compression welding of indium bumps.

In a second variant of the second embodiment, as shown in FIGS. 6A–E, the suspended microstructures are made nonplanar by sculpturing the surface of the Si wafer on which the thin film microstructures are deposited. The starting Si wafer 602 is first etched, after applying the appropriate lithographic mask, so that the suspended parts of the microstructures will be located on a lower level than the parts of the structures that are to be attached to the multiplexer chip. An anisotropic etch,. or an orientation-dependent etching, is used to produce a sloped etch profile so that the Si surface topography does not change abruptly. Typically, the Si topography consists of posts, such as the post 638, whose top surfaces are the original surface of the Si wafer and whose height is the amount of Si etched, which is typically 2–5 microns.

As with the previous embodiments, depositions are made on a silicon wafer substrate 602 of an $SiO_2$ layer 604, an $Si_3N_4$ layer 606, and a $VO_2$ layer 608, followed by contact metal pads, such as the contact pad 610. This is followed by the deposition of a nitride overcoat 612. Proceeding to FIG. 6B, a suitable metal film 633 such as Al is deposited and delineated to form caps on the top surfaces of the posts and also to connect electrically to the input leads of the Si integrated circuit.

Figure 6A:
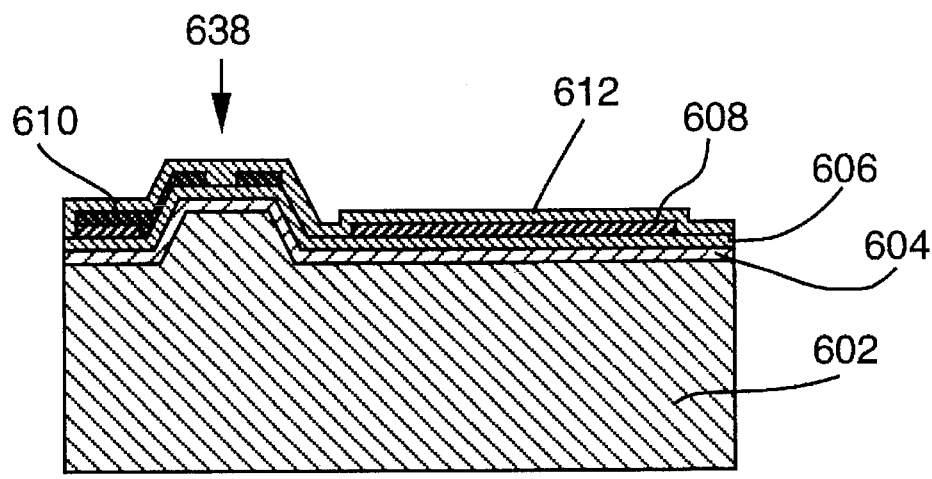
FIGS. 6A–6E are cross sectional schematic diagrams depicting suspended microstructure fabrication, illustrating an embodiment in which the suspend microstructures are made nonplanar by sculpturing the surface of the wafer on which the structures are deposited.
Figure 6B:
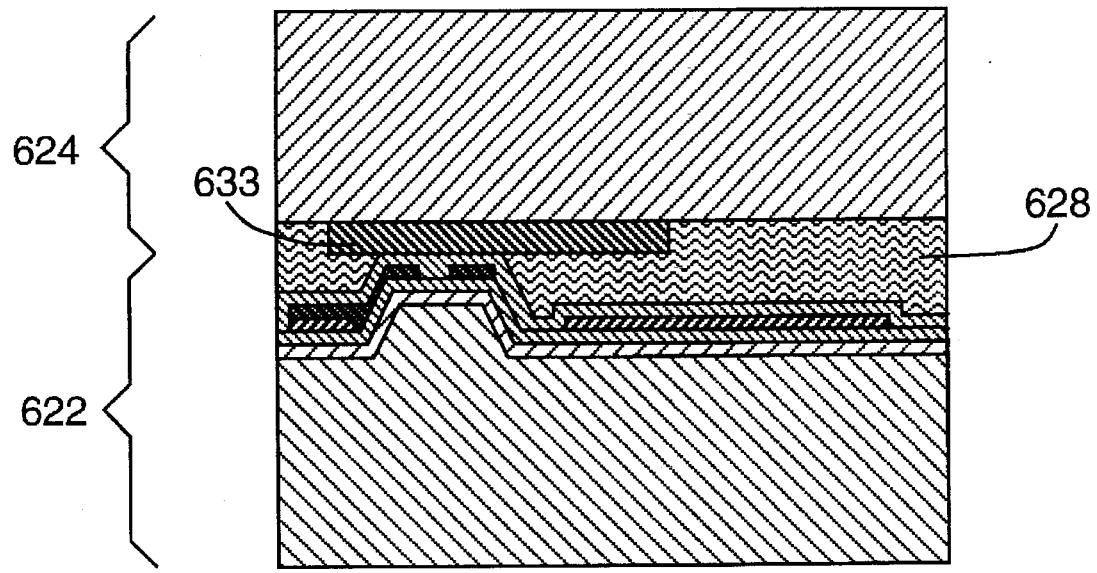
Figure 6C:
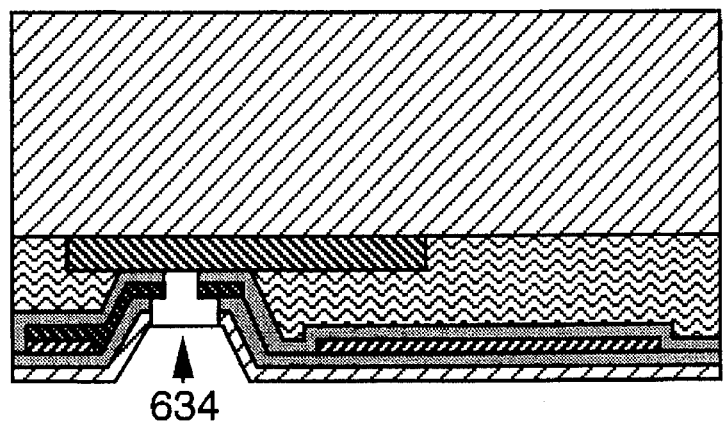

The detector wafer 622 with the suspended microstructures is bonded to the multiplexer wafer 624 using an epoxy adhesive 628. The silicon substrate is then removed from the detectors, as shown in FIG. 6C, and vias, such as the contact hole 634, are opened in the transferred thin film structures through the oxide and first nitride layers, going through the second nitride film 612 in the holes within the annular contact pads and stopping on the detector contact 633. This is followed by dry etching in an oxygen plasma to remove any thin epoxy layer that may exist in the vias between the bolometer and the multiplexer contact pads.

Figure 6D:
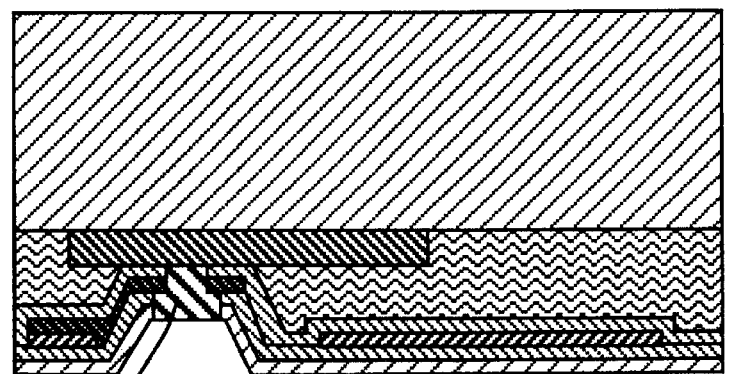
Figure 6E:
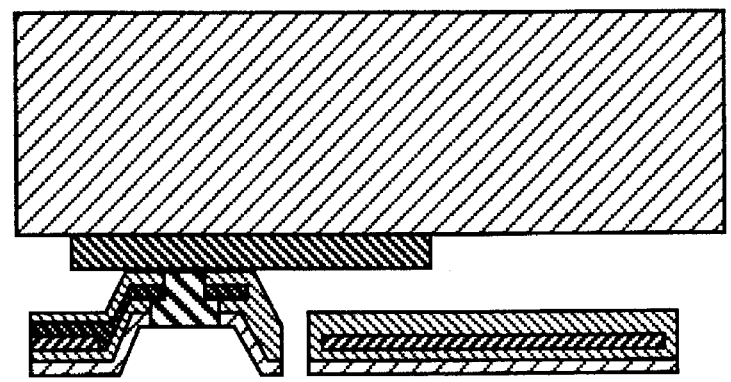

Now, as shown in FIG. 6D, the interconnections are made by depositing a relatively thick film 636 to join both the detector and the multiplexer metal pads. The wafers are then diced into individual devices and the epoxy is removed using oxygen plasma, leaving the completed detector shown in FIG. 6E.

Embodiment 3

In this embodiment, as shown in FIGS. 7A–7E, the basic scheme of embodiment 1 or 2 is enhanced by the additional deposition of a removable layer to allow stacked levels of suspended structures. This enhanced structure provides a number of advantages for some applications. When used with thermal detectors, for example, it allows nearly all of the pixel area to be filled with detector material and at the same time permits extended lead length for better thermal isolation. This embodiment is illustrated as a derivative of Embodiment 1, but note that those versed in the art will be readily able to derive a similar structure from variants of Embodiment 1 or from Embodiment 2 or its variants.

Figure 7A:
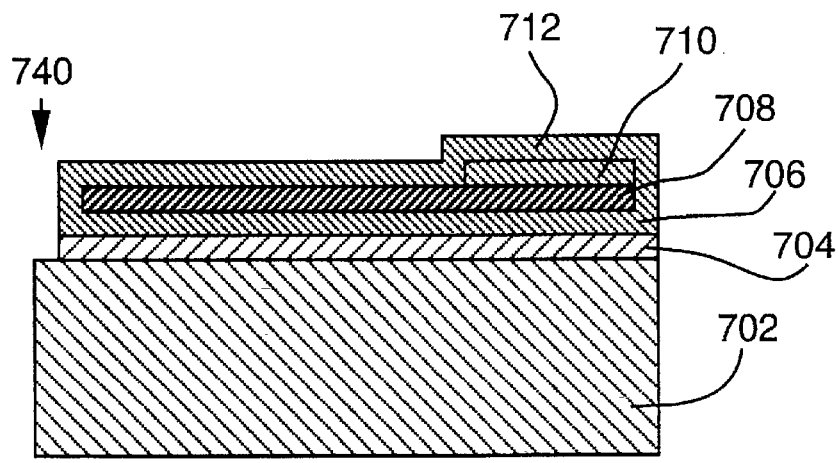
FIGS. 7A–7E depict a variation of the suspended microstructure fabrication process in which a removable layer is deposited to allow stacked levels of suspended structures.

Embodiment 3 begins similar to Embodiment 1, as shown in FIG. 7A, with a temporary substrate 702 on which are deposited a layer 704 of $SiO_2$, a layer 706 of $Si_3N_4$, and a layer 708 of $VO_2$. The $VO_2$ or other material is patterned into detectors, receives contact metalization 710, and is overcoated with another layer 712 of $Si_3N_4$ (in the case of $VO_2$). The shape of the detector patterns is different, however, due to the absence of the need for narrow thermal isolation leads at the detector level of the structure. After the last $Si_3N_4$ deposition, the detectors are isolated from each other by reactive ion etching or ion milling through both $Si_3N_4$ and $SiO_2$ down to the silicon substrate, as shown at the location 740.

Figure 7B:
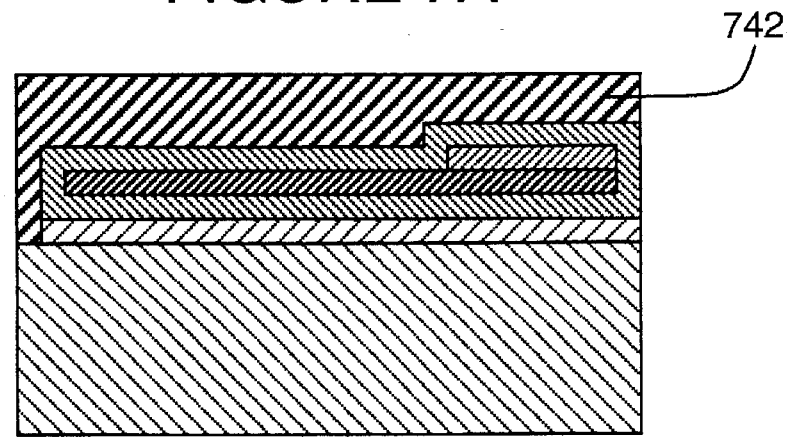
Figure 7C:
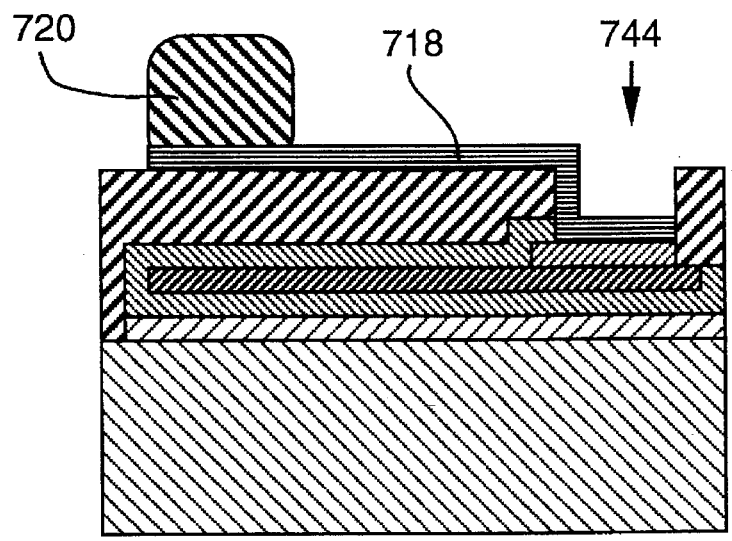
Figure 7D:
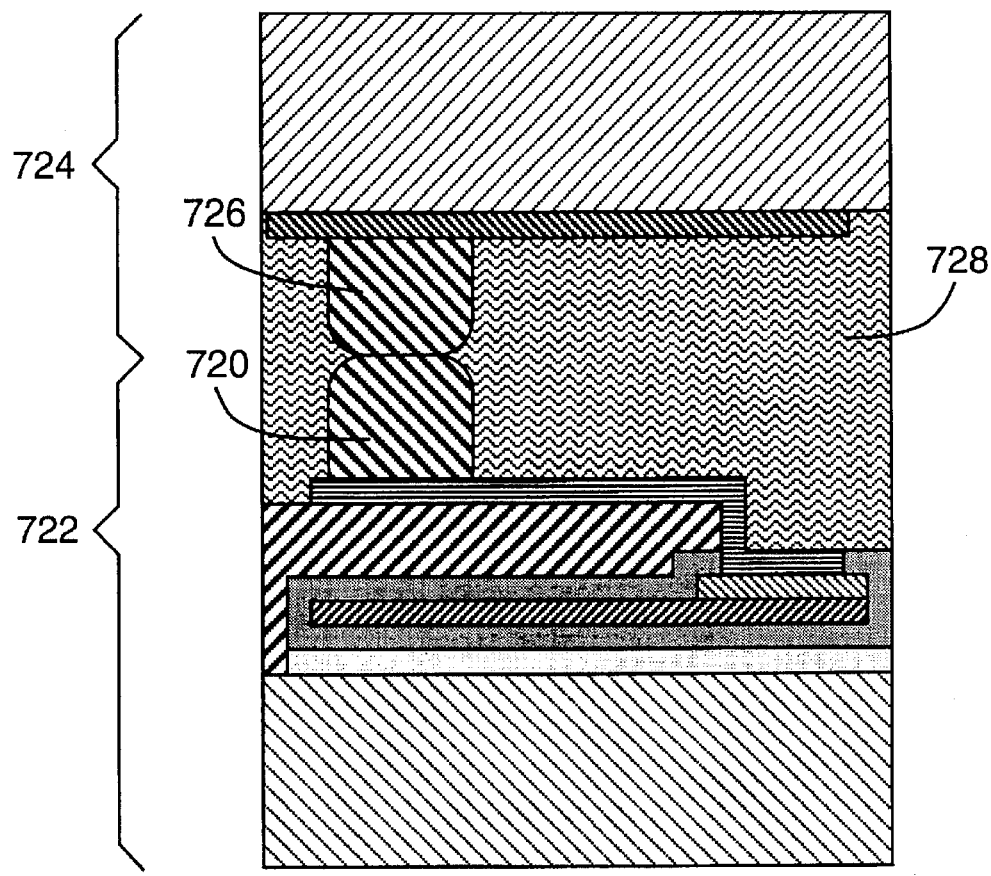

As shown in FIG. 7B, the patterned detectors are overcoated with a few microns of a polymer film 742, such as photosensitive polyimide or another organic material which can be photolithographically patterned and which is resilient to subsequent processing, including moderate deposition temperatures and deposition and removal of conventional photoresist. Proceeding to FIG. 7C, the polyimide, is photolithographically patterned to open contact holes, such as the hole 744, to the contact pads on the detectors (two per detector). If necessary, the protective $Si_3N_4$ layer is removed in the contact area by reactive ion etching or another chemical or mechanical process. Two thin, meandering contact metal lines (typically of nichrome) for each detector, such as the line 718, are deposited and delineated on the polyimide so that one end of each line contacts a detector pad and the other end of the line terminates in a metal pad suitable for an indium column. If necessary for structural strength, this meandering contact is overcoated with $Si_3N_4$ deposited at a temperature compatible with polyimide (typically <300 C). The nitride is subsequently patterned photolithographically and reactive ion etched into a similar meandering pattern to open contact holes to the metal pads for indium columns. As in Embodiment 1, indium bumps, such as the bump 720, are deposited on the nichrome film through the contact holes in the nitride layer.

Figure 7E:
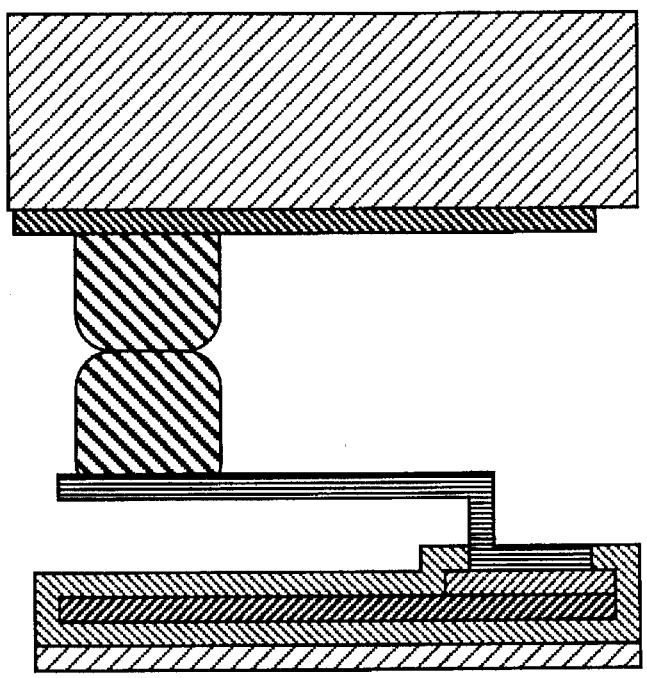

From this point the process proceeds as in Embodiment 1. Moving to FIG. 7D, a multiplexer wafer 724 containing corresponding microstructure arrays of circuits is hybridized to the wafer 722 by joining corresponding In columns, such as the columns 720 and 726, then filling with epoxy 728. As shown in FIG. 7E, the substrate 702 is then removed and the epoxy is removed, leaving suspended structures.

Although the embodiments described above have demonstrated the application of the invention to thermal detector arrays, the inventive technique is potentially applicable to a number of other devices. Modifications and additional embodiments will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

We claim:

1. A method of making a suspended microstructure, comprising the steps of:

providing a temporary substrate having a first surface;

fabricating a first microstructure on the first surface to form a first microstructure assembly;

providing a final substrate having a second surface;

fabricating a second microstructure on the second surface to form a second microstructure assembly;

forming at least one connecting element joining the first microstructure assembly and the second microstructure assembly such that the first and second surfaces are opposed with a predetermined separation and alignment between the first and second microstructures;

introducing a removable bonding medium into the separation between the first and second microstructures to temporarily secure the first microstructure assembly to the second microstructure assembly;

removing the temporary substrate after introducing the removable bonding medium; and removing the bonding medium, thereby leaving; the first micro, structure affixed to the final substrate while preserving the separation and alignment between the first and second microstructures.

2. The method of claim 1, wherein the step of forming at least one connecting element comprises the step of:

attaching at least one electrically conductive contact between the first microstructure assembly and the second microstructure assembly such that the first and second surfaces are opposed with a predetermined separation and alignment between the first and second microstructures and such that an electrical connection is established between the first and second microstructures.

3. The method of claim 2, wherein the step of attaching at least one electrically conductive contact comprises the step of:

attaching at least one electrically conductive contact of material selected from the group consisting of alloys of indium, tin, lead, bismuth, and gallium between the first microstructure assembly and the second microstructure, assembly such that the first and second surfaces are opposed with a predetermined separation and alignment between the first and second microstructures and such that an electrical connection is established between the first and second microstructures.

4. The method of claim 1, wherein the step of forming at least one connecting element comprises the step of:

attaching at least one electrically nonconductive spacer between the first microstructure assembly and the second microstructure assembly such that the first and second surfaces are opposed with a predetermined separation and alignment between the first and second microstructures.

5. The method of claim 4, further comprising, after the step of removing the temporary substrate, the step of:

forming at least one electrically conductive contact to the first microstructure from a back side of the first microstructure assembly opposite the connecting element between the first microstructure assembly and the second microstructure assembly.

6. The method of claim 1, wherein the step of fabricating a first microstructure comprises the step of:

fabricating a first microstructure, including a removable layer to enable multiple level suspended structures, on the first surface to form a first microstructure assembly.

7. The method of claim 1, wherein the step of introducing a removable bonding medium further comprises the step of:

injecting an organic bonding medium between the first and second microstructures to temporarily secure the first microstructure assembly to the second microstructure assembly.

8. The method of claim 7, wherein the step of removing the bonding medium further comprises the step of:

removing the organic bonding medium by dry etching with an oxygen plasma, thereby leaving the first micro structure affixed to the final substrate while preserving the separation and alignment between the first and second microstructures.

9. The method of claim 1, further comprising, prior to the step of removing the bonding medium, the step of:

dicing the affixed first microstructure, second microstructure, and final substrate assembly to facilitate, after the step of removing the bonding medium, separating the assembly into a plurality of suspended microstructure devices.

10. The method of claim 1, further comprising, after the step of removing the bonding medium, the step of:

dicing the affixed first microstructure, second microstructure, and final substrate assembly to separate the assembly into a plurality of suspended microstructure devices.

* * * * *